United States Patent
Tsai et al.

(10) Patent No.: US 9,324,603 B2
(45) Date of Patent: Apr. 26, 2016

(54) SEMICONDUCTOR STRUCTURES WITH SHALLOW TRENCH ISOLATIONS

(71) Applicant: Taiwan Semiconductor Manufacturing Co., Ltd., Hsinchu (TW)

(72) Inventors: Shin-Yeu Tsai, Zhubei (TW); Chia-Hui Lin, Dajia Township, Taichung County (TW); Ching-Yu Chen, Keelung (TW); Chui-Ya Peng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 13/967,558

(22) Filed: Aug. 15, 2013

(65) Prior Publication Data

US 2015/0048475 A1    Feb. 19, 2015

(51) Int. Cl.
*H01L 21/762* (2006.01)

(52) U.S. Cl.
CPC .... *H01L 21/76224* (2013.01); *H01L 21/76229* (2013.01)

(58) Field of Classification Search
CPC .............. H01L 29/06; H01L 21/76224; H01L 21/76229
USPC .................... 438/690–692, 700, 750
See application file for complete search history.

(56) References Cited

U.S. PATENT DOCUMENTS

| | | | |
|---|---|---|---|
| 5,691,215 A * | 11/1997 | Dai et al. | 438/305 |
| 5,830,773 A * | 11/1998 | Brennan | H01L 21/31055 257/E21.245 |
| 6,056,864 A * | 5/2000 | Cheung | C25D 5/48 205/157 |
| 2006/0134559 A1* | 6/2006 | Ha | 430/312 |
| 2010/0184295 A1* | 7/2010 | Sato et al. | 438/702 |

* cited by examiner

*Primary Examiner* — Tucker J Wright
(74) *Attorney, Agent, or Firm* — Maschoff Brennan

(57) ABSTRACT

A method is disclosed that includes the operations outlined below. An insulating material is disposed within a plurality of trenches on a semiconductor substrate and over the semiconductor substrate. The first layer is formed over the insulating material. The first layer and the insulating material are removed.

23 Claims, 5 Drawing Sheets

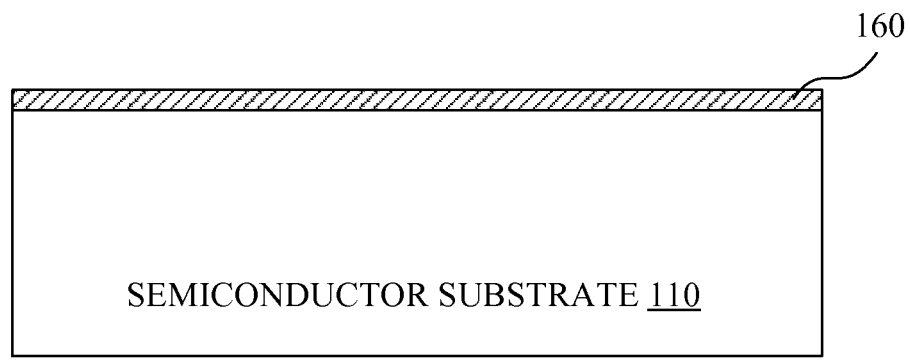
FIG. 3A1
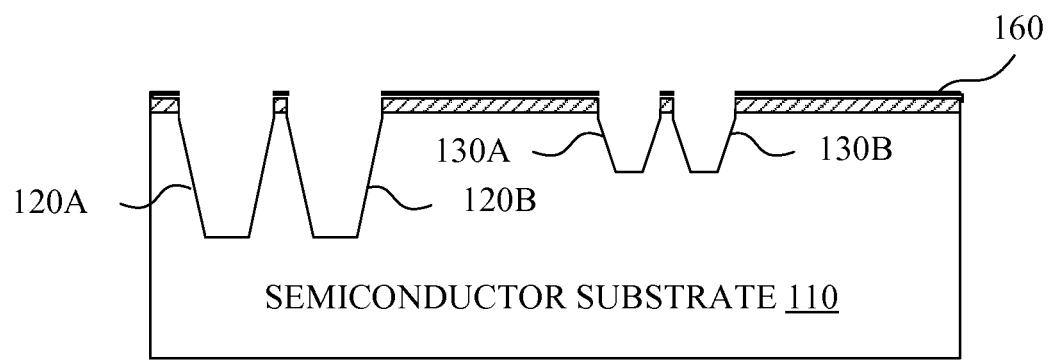
FIG. 3A2

FIG. 3A3

SEMICONDUCTOR STRUCTURES WITH SHALLOW TRENCH ISOLATIONS

FIELD

The present disclosure relates to semiconductor structures with shallow trench isolations.

BACKGROUND

Shallow trench isolation (STI) is a semiconductor structure which prevents electrical current leakage between adjacent semiconductor device components. Generally speaking, shallow trench isolation is formed early during a semiconductor device manufacturing process, before transistors are formed. However, when shallow trench isolation structures are formed and have different depths, the manufacturing process becomes complex.

BRIEF DESCRIPTION OF THE DRAWINGS

The disclosure can be more fully understood by reading the following detailed description of various embodiments, with reference to the accompanying drawings as follows:

FIGS. 3A1-3D are cross sectional views of the semiconductor device in FIG. 1 at different stages of a manufacturing process, in accordance with some embodiments of the present disclosure.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
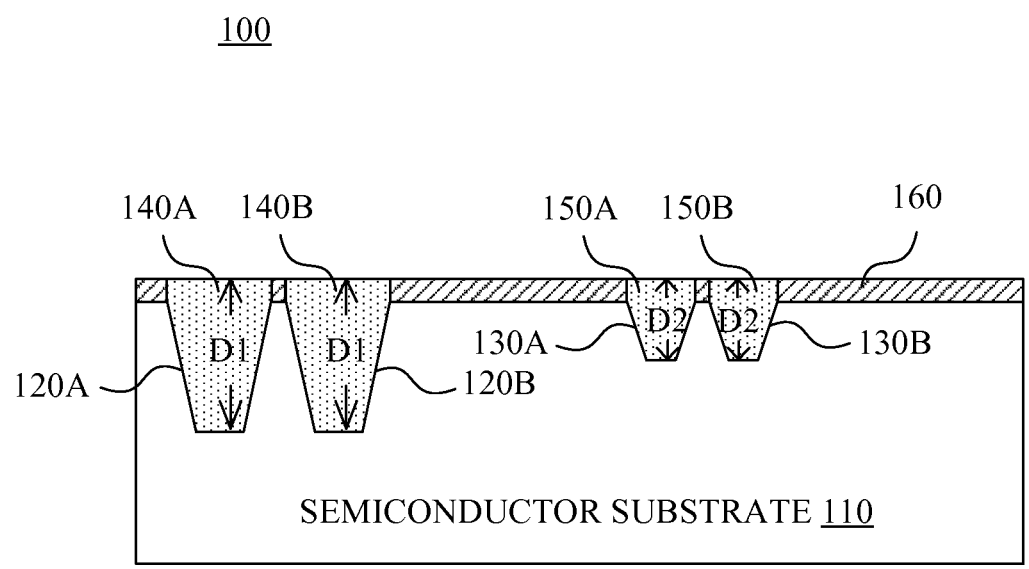
FIG. 1 is a cross sectional view of a semiconductor device in accordance with some embodiments of the present disclosure.

FIG. 1 is a cross sectional view of a semiconductor device 100 in accordance with some embodiments of the present disclosure.

In the semiconductor device 100, a semiconductor substrate 110 includes trenches 120A, 120B, 130A and 130B. In some embodiments, the trenches 120A and 120B have a same depth D1, and the trenches 130A and 130B have a same depth D2. The depth D1 is larger than the depth D2. The depth D1 of the trenches 120A and 120B and the depth D2 of the trenches 130A and 130B are for illustrative purposes. Different depths of the trenches 120A, 120B, 130A, and 130B are within the contemplated scope of the present disclosure.

Insulating materials 140A, 140B, 150A and 150B, which are illustratively shown as dotted blocks in FIG. 1, are disposed within the trenches 120A, 120B, 130A and 130B, respectively. In some embodiments, insulating materials 140A, 140B, 150A and 150B are oxide or nitride. Other suitable materials for the insulating materials 140A, 140B, 150A and 150B are within the contemplated scope of the present disclosure.

Each trench of the trenches 120A, 120B, 130A, and 130B together with the corresponding insulating materials 140A, 140B, 150A and 150B forms a shallow trench isolation (STI) structure. Explained in a different way, the trench 120A with the insulating material 140A, the trench 120B with the insulating material 140B, the trench 130A with the insulating material 150A, and the trench 130B with the insulating material 150B, are each formed as an STI structure. In some embodiments, the STI structure provides an electrical isolation mechanism to prevent semiconductor elements (not shown) formed in neighboring areas from electrically connecting to each other.

The number, shape and position of the trenches in FIG. 1 are for illustrative purposes. Various other numbers, shapes and positions of trenches are within the contemplated scope of the present disclosure.

In some embodiments, a nitride layer 160 is formed on the semiconductor substrate 110. Each trench of the trenches 120A, 120B, 130A and 130B is formed within the nitride layer 160 and the semiconductor substrate 110. The nitride layer 160 protects the semiconductor substrate 110 from damages while being etched during the formation of the STI structures. Details of the formation of the STI structures are explained with reference to FIG. 2 and FIGS. 3A1-3D.

Figure 2:
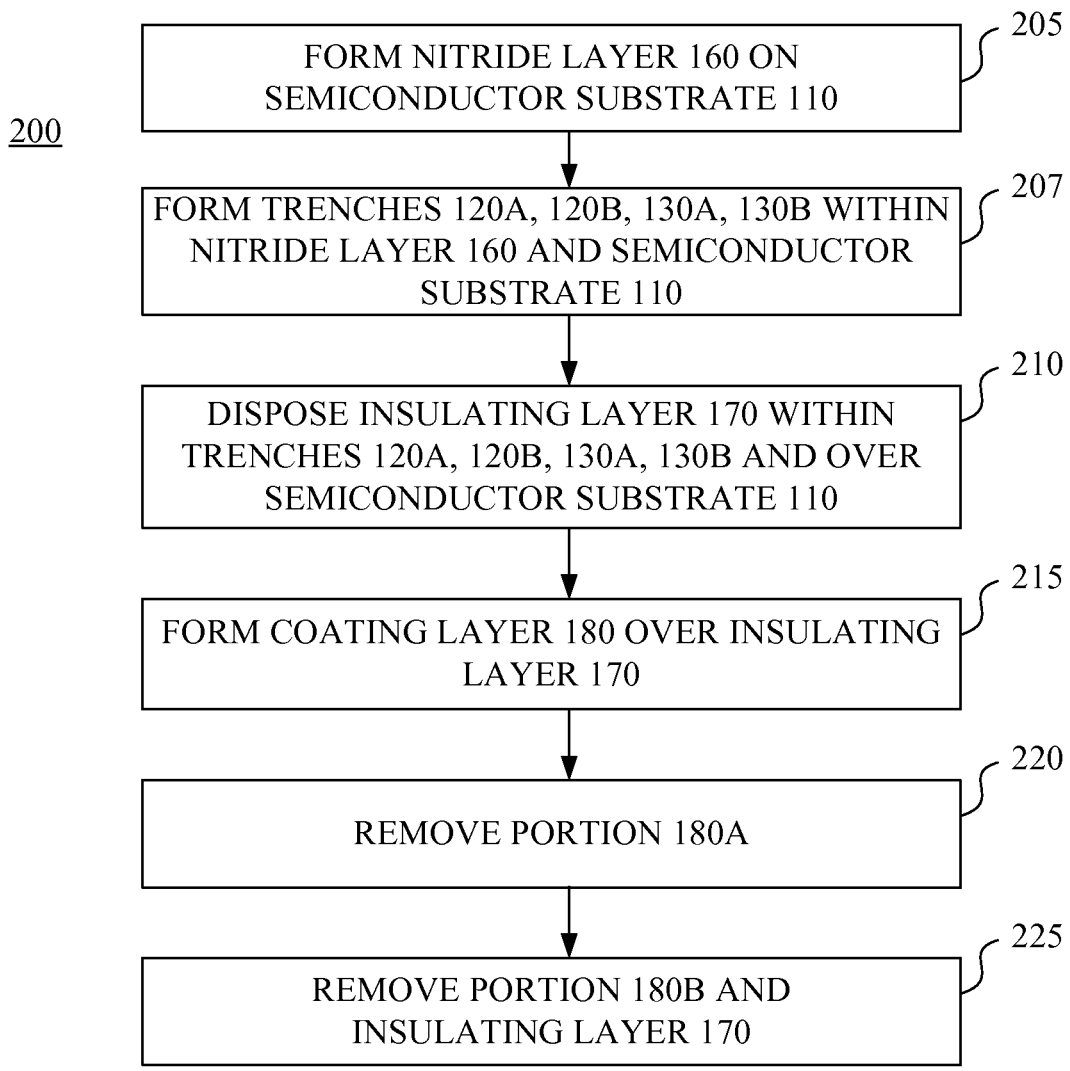
FIG. 2 is a flow chart of a method illustrating the manufacturing process of the semiconductor device in FIG. 1, in accordance with some embodiments of the present disclosure.

FIG. 2 is a flow chart of a method 200 illustrating the manufacturing process of the semiconductor device 100 in FIG. 1, in accordance with some embodiments of the present disclosure. For illustration, the manufacturing process of the semiconductor device 100 in FIG. 1 is described by the method 200 together with FIGS. 3A1-3D.

FIGS. 3A1-3D are cross sectional views of the semiconductor device 100 at different stages of a manufacturing process, in accordance with some embodiments of the present disclosure. After the different stages in FIGS. 3A1-3D, the semiconductor device 100 has the cross sectional view in FIG. 1.

With reference to the method 200 in FIG. 2, in operation 205, a nitride layer 160 is formed on a semiconductor substrate 110, as illustrated in FIG. 3A1.

In operation 207, trenches 120A, 120B, 130A and 130B are formed within the nitride layer 160 and the semiconductor substrate 110, as illustrated in FIG. 3A2.

In operation 210, an insulating layer 170 is disposed within the trenches 120A, 120B, 130A and 130B and over the semiconductor substrate 110, as illustrated in FIG. 3A3. In some embodiments, an insulating material is disposed within the trenches 120A, 120B, 130A and 130B and over the semiconductor substrate 110 to form the insulating layer 170.

In some embodiments, the trenches 120A, 120B, 130A and 130B have different depths. For illustration, the depth of the trenches 120A and 120B is larger than that of the trenches 130A and 130B. Because the depth of the trenches 120A and 120B is different from that of the trenches 130A and 130B, the insulating layer 170 formed above the nitride layer 160 is not uniform. For example, a thickness t1 is different from a thickness t2, which is different from a thickness t3, etc.

Figure 3B:
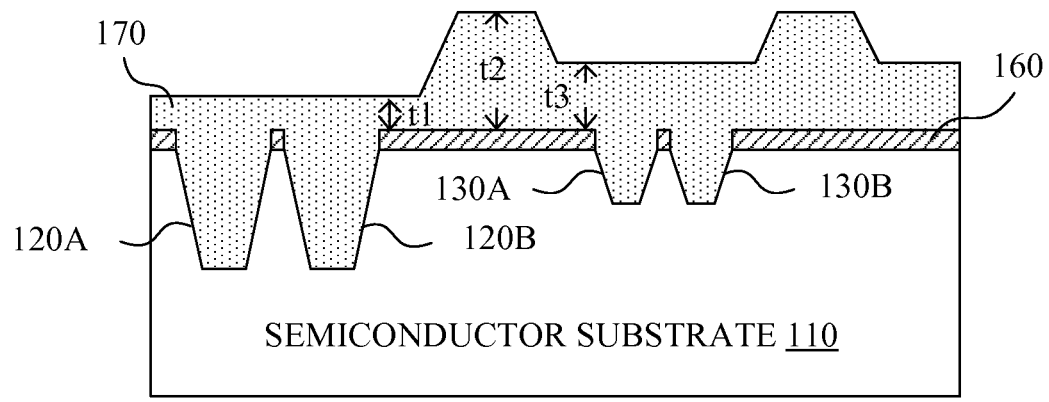
Figure 3B:
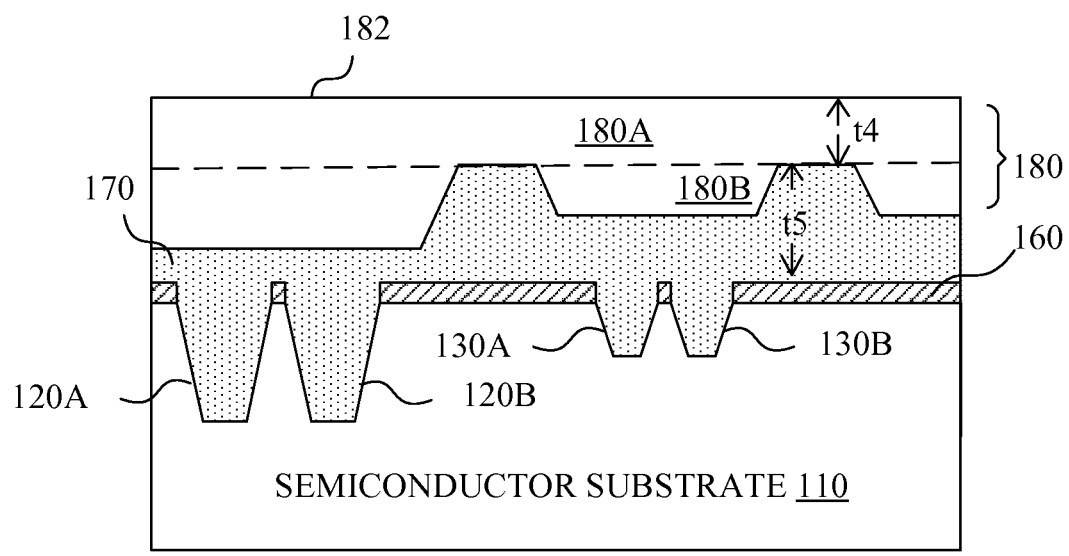

In operation 215, a coating layer 180 is formed over the insulating layer 170, and has a substantially flat surface 182, as illustrated in FIG. 3B. In some embodiments, the coating layer 180 is formed over the insulating layer 170 by a spin-coating process. Other ways to form the coating layer 180 are within the scope of the present disclosure. For illustration, the coating layer 180 has a portion 180A and a portion 180B. The portion 180A has the substantially flat surface 182. The portion 180B covers and contacts the insulating layer 170.

In some embodiments, the coating layer 180 includes a layer of photoresist. In further embodiments, the layer of photoresist is formed by coating photoresist on the insulating layer 170 and baking the coated photoresist within a temperature range of, for example, 100-200° C. In some embodiments, the photoresist is a product which has a model number TMDR or STR95CM. Various temperatures are used according to various types of photoresist. Various types of photoresist and various temperatures are within contemplated scope of the present disclosure.

In some other embodiments, the coating layer 180 includes a layer of spin-on glass (SOG). In further embodiments, the layer of SOG includes oxide or other suitable materials. Moreover, in some embodiments, the layer of SOG is formed by coating SOG on the insulating layer 170 and curing the SOG within a temperature range of, for example, 200-300° C. for 1 hour.

The coating layer 180 has the substantially flat surface 182, and therefore, the structure in FIG. 3B is substantially uniform. As a result, the portion 180B and a portion of the insulating layer 170 in FIG. 3B can be uniformly removed in the subsequent of the manufacturing process.

Figure 3C:
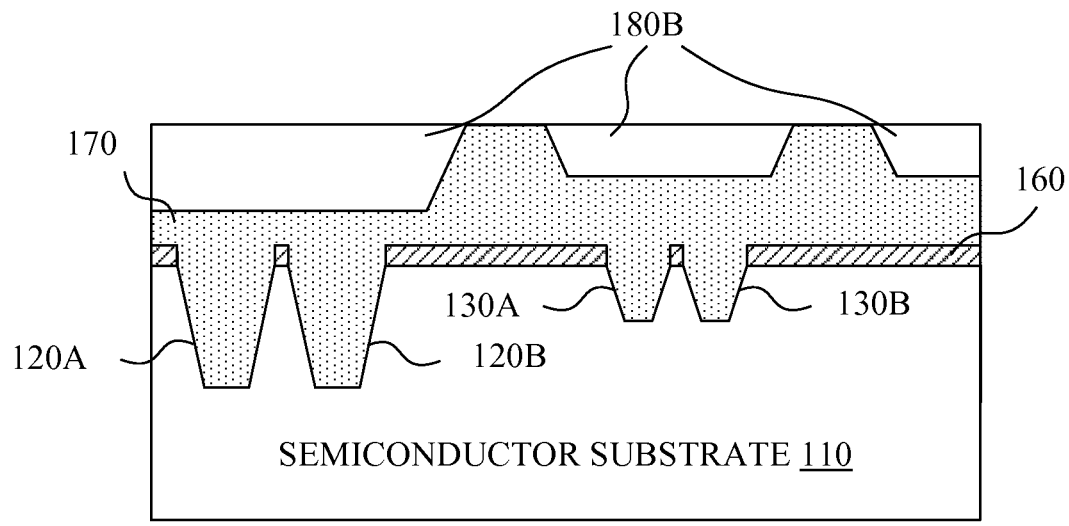

In operation 220, the portion 180A in FIG. 3B is removed, as illustrated in FIG. 3C. As a result, the portion 180B is remained, and the insulating layer 170 is exposed. In some embodiments, the portion 180A is removed by at least one of a chemical mechanical polishing (CMP) process, an etching process, a sputter process, a laser process, and the combinations thereof. In further embodiments, the etching process is a dry etching process or a wet etching process. Other ways of removing the portion 180A are within the contemplated scope of the present disclosure.

In some other embodiments, the portion 180A in FIG. 3B is removed, and the portion 180B and the insulating layer 170 are partially removed. In various embodiments, the portion 180A in FIG. 3B is partially removed, and therefore, the insulating layer 170 is not exposed.

Figure 3D:
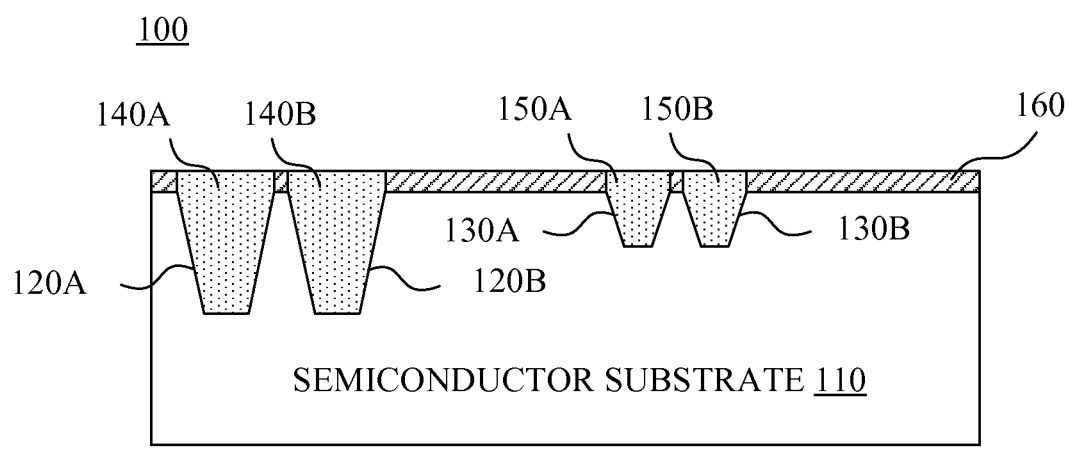

In operation 225, the portion 180B and the insulating layer 170 above the nitride layer 160 are removed, as illustrated in FIG. 3D. As a result, the STI structures corresponding to the trenches 120A, 120B, 130A, and 130B and the insulating materials 140A, 140B, 150A and 150B are formed. In some embodiments, the portion 180B and the insulating layer 170 are removed by the CMP process. Other ways of removing are within the scope of the present disclosure.

In some embodiments, in order to uniformly remove the coating layer 180 and the insulating layer 170 in the operation 225 in FIG. 2, the coating layer 180 is selected to have an etch rate similar to that of the insulating layer 170. As a result, the coating layer 180 and the insulating layer 170 are removed at the same speed to maintain uniformity.

In some embodiments, the coating layer 180 and the insulating layer 170 above the nitride layer 160 in FIG. 3B are removed by using the CMP process in one operation. For example, the structure in FIG. 3D is formed directly from the structure in FIG. 3B without the operations with reference to FIG. 3C. Different removing processes to directly result from the structure in FIG. 3B to the structure in FIG. 3D are within the scope of the present disclosure.

In some embodiments, when the coating layer 180 in FIG. 3B is relatively thick, the structure in FIG. 3D is formed through the operations with reference to FIG. 3C. For example, in FIG. 3B, there exist a thickness t4 between the top of the insulating layer 170 and the surface 182, and a thickness t5 between the nitride layer 160 and the top of the insulating layer 170. When the thickness t4 is larger than a certain percentage, for example, 50%, of the thickness t5, the portion 180A is removed first by using the etching process, as illustrated in FIG. 3C. The portion 180B and the insulating layer 170 are then removed by using the CMP process in one operation, as illustrated in FIG. 3D.

The cross sectional view of the semiconductor device 100 in FIG. 3D is the cross sectional view of the semiconductor device 100 FIG. 1.

In some embodiments, a method is disclosed that includes the operations outlined below. An insulating material is disposed within a plurality of trenches on a semiconductor substrate and over the semiconductor substrate. The first layer is formed over the insulating material. The first layer and the insulating material are removed.

Also disclosed is a method that includes the operations outlined below. An insulating layer is coated with a first layer by a spin-coating process. The first layer and the insulating layer are removed. The insulating layer fills a plurality of trenches on a semiconductor substrate and covers the semiconductor substrate. At least two of the plurality of trenches have different depths.

Also disclosed is a semiconductor device that includes a semiconductor substrate, a plurality of trenches, an insulating material and a first layer over the insulating material. The plurality of trenches is formed on the semiconductor substrate. The insulating material is disposed within the plurality of trenches and over the semiconductor substrate. The first layer is over the insulating material.

In this document, the term "connected" may be termed as "electrically connected", and the term "coupled" may be termed as "electrically coupled". "Connected" and "coupled" may also be used to indicate that two or more elements cooperate or interact with each other.

The above illustrations include exemplary operations, but the operations are not necessarily performed in the order shown. Operations may be added, replaced, changed order, and/or eliminated as appropriate, in accordance with the spirit and scope of various embodiments of the present disclosure.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A method comprising:
   disposing an insulating material within a plurality of trenches on a semiconductor substrate and over the semiconductor substrate, wherein at least two trenches of the plurality of the trenches have different depths;
   forming, in one operation, a first layer having a substantially flat surface, over the insulating material; and
   removing the first layer and the insulating material;
   wherein a portion of the first layer is etched, a remaining portion of the first layer and the insulating material are removed by a chemical mechanical polishing (CMP) process, and the portion of the first layer is thicker than a percentage of the remaining portion of the first layer.

2. The method of claim 1, wherein the first layer is formed by a spin-coating process.

3. The method of claim 1, wherein the insulating material comprises oxide.

4. The method of claim 1, wherein the first layer comprises a layer of photoresist.

5. The method of claim 1, wherein removing the first layer and the insulating material is performed by at least one of a chemical mechanical polishing (CMP) process, an etching process, a sputter process, a laser process and combinations thereof.

6. The method of claim 1, wherein the first layer and the insulating material have a similar etch rate.

7. The method of claim 1, wherein the first layer and the insulating material are removed by a chemical mechanical polishing (CMP) process in one operation.

8. The method of claim 1, wherein the first layer comprises a layer of spin-on glass (SOG).

9. The method of claim 1, wherein the first layer is a single layer having a same type of material.

10. The method of claim 1, wherein the first layer is formed over the insulating material before disposing of another material on the insulating material.

11. The method of claim 1, wherein the first layer is formed over the insulating material without another material there between.

12. The method of claim 1, wherein the first layer is formed in contact with the insulating material over an entirety of the insulating material.

13. A method comprising:
   coating, in one operation, an insulating layer with a first layer having a substantially flat surface by a spin-coating process; and
   removing the first layer and the insulating layer;
   wherein the insulating layer fills a plurality of trenches on a semiconductor substrate and covers the semiconductor substrate, and
   at least two of the plurality of trenches have different depths;
   wherein a portion of the first layer is etched, a remaining portion of the first layer and the insulating layer are removed by a chemical mechanical polishing (CMP) process, and the portion of the first layer is thicker than a percentage of the remaining portion of the first layer.

14. The method of claim 13, wherein a material of the insulating layer comprises oxide.

15. The method of claim 13, wherein the first layer comprises a layer of photoresist.

16. The method of claim 13, wherein removing the first layer and the insulating layer is performed by at least one of a chemical mechanical polishing (CMP) process, an etching process, a sputter process, a laser process and combinations thereof.

17. The method of claim 13, wherein the first layer and the insulating layer have a similar etch rate.

18. The method of claim 13, wherein the first layer and the insulating layer are removed by a chemical mechanical polishing (CMP) process in one operation.

19. The method of claim 13, wherein the first layer comprises a layer of spin-on glass (SOG).

20. The method of claim 13, wherein the first layer is a single layer having a same type of material.

21. The method of claim 13, wherein the first layer is formed over the insulating layer before disposing of another material on the insulating layer.

22. The method of claim 13, wherein the first layer is formed over the insulating layer without another material there between.

23. The method of claim 13, wherein the first layer is formed in contact with the insulating layer over an entirety of the insulating layer.

* * * * *